US011056208B1

(12) United States Patent
Jayaraman et al.

(10) Patent No.: US 11,056,208 B1
(45) Date of Patent: Jul. 6, 2021

(54) DATA DEPENDENT SENSE AMPLIFIER WITH SYMMETRIC MARGINING

(71) Applicant: GLOBALFOUNDRIES U.S. INC., Santa Clara, CA (US)

(72) Inventors: Balaji Jayaraman, Bangalore (IN); Ramesh Raghavan, Narsingi (IN); Rajesh Reddy Tummuru, Bengaluru (IN); Toshiaki Kirihata, Poughkeepsie, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/801,728

(22) Filed: Feb. 26, 2020

(51) Int. Cl.
*G11C 17/00* (2006.01)
*G11C 17/18* (2006.01)
*G11C 17/16* (2006.01)

(52) U.S. Cl.
CPC ............. *G11C 17/18* (2013.01); *G11C 17/16* (2013.01)

(58) Field of Classification Search
CPC ................................ G11C 17/18; G11C 17/16
USPC ............................................................ 365/96
See application file for complete search history.

(56) References Cited

U.S. PATENT DOCUMENTS

| 4,541,073 | A | * | 9/1985 | Brice | H03K 3/356008 |
| | | | | | 365/185.07 |
| 9,460,760 | B2 | | 10/2016 | Jayaraman et al. | |
| 9,779,783 | B2 | | 10/2017 | Anand et al. | |
| 10,679,681 | B1 | * | 6/2020 | Wu | G11C 7/06 |
| 2019/0108895 | A1 | | 4/2019 | Fifield | |

* cited by examiner

*Primary Examiner* — Huan Hoang
(74) *Attorney, Agent, or Firm* — Michael Le Strange; Andrew M. Calderon; Roberts Calderon Safran & Cole, P.C.

(57) ABSTRACT

The present disclosure relates to a data dependent sense amplifier with symmetric margining. In particular, the present disclosure relates to a structure including a bias generator circuit that is configured to provide symmetric margining between two logic states of a memory circuit.

19 Claims, 5 Drawing Sheets

DATA DEPENDENT SENSE AMPLIFIER WITH SYMMETRIC MARGINING

FIELD OF THE INVENTION

The present disclosure relates to a data dependent sense amplifier with symmetric margining, and more particularly, to a circuit for a data dependent sense amplifier with symmetric margining for charge trap transistor memories and methods of operation.

BACKGROUND

In high density memory systems, a typical non-volatile memory cell may include a metal-oxide semiconductor (MOS) transistor whose threshold voltage may be varied for storing desired information, e.g., by injecting charges into a floating gate or gate oxide. Accordingly, a current sunk by the memory cell in determining biasing state varies depending on the information stored therein. For example, to store information in a twin-transistor single-bit memory cell there is provided two different threshold voltage values associated with a different logic or bit value.

As an example, a known charge-trap transistor one time programmable memory (CTT OTPM) sense amplifier exhibits an asymmetry between the true and complement field effect transistors (FETs) for margining between a "1" and "0". The asymmetry is more pronounced at larger threshold voltage (Vt) shifts.

In known CTT OTPM systems, a diode-connected PFET is configured on a true side of a sense amplifier. Therefore, a data-dependent bias is created for the sense amplifier that works well for threshold voltage (Vt) shifts up to 60-70 millivolts. However, at larger threshold voltage (Vt) shifts (i.e., above 70 millivolts), significant asymmetry occurs between the margining of the true and complement cells. In particular, margining applied on the true side varies dynamically with the threshold voltage (Vt) shifts in the true cell. Further, the asymmetry increases as the threshold voltage (Vt) shifts increases above 70 millivolts (i.e., the asymmetry gets worse at higher Vt shifts).

SUMMARY

In an aspect of the disclosure, a structure includes a bias generator circuit that is configured to provide symmetric margining between two logic states of a memory circuit across a threshold voltage shift.

In another aspect of the disclosure, a circuit includes a bias generator circuit that is configured to provide symmetric margining between two logic states by generating a first bias signal and a second bias signal, and a sense amplifier and margining circuit which is configured to receive the first bias signal and the second bias signal to provide a control margin to balance a margining current in response to programming of a twin-cell transistor circuit.

In another aspect of the disclosure, a method includes programming one of a true side or a complement side of a twin-cell transistor circuit, generating a first bias signal and a second bias signal in a bias generator circuit in response to the programming of the twin-cell transistor circuit, receiving the first bias signal and the second bias signal at the sense amplifier and margining circuit, and generating a symmetric margin current in the sense amplifier and margining circuit across a threshold voltage shift of the twin-cell transistor circuit in response to the sense amplifier and margining circuit receiving the first bias signal and the second bias signal.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a data dependent sense amplifier with symmetric margining, and more particularly, to a circuit for a data dependent sense amplifier with symmetric margining for charge trap transistor memories and methods of operation. Advantageously, by implementing the circuits disclosed herein, symmetric margining occurs for programming "1" and "0". Also, by implementing the circuits disclosed herein, symmetric margining for programming can be supported up to 300 millivolts.

In known sense amplifier circuits, a voltage at a MID node is determined by a true cell threshold voltage of a twin cell. Further, a MID voltage of the MID node determines a margin current (set as a PFET bias) for both true and complement paths. The total margining current (i.e., $I_{MT}$ or $I_{MC}$) is determined by sense amplifier margin bits (i.e., SA_MARG<2:0> bits). For a true cell to be programmed with margining applied on a complement path, the complement margining current (i.e., $I_{MC}$) is a function of the threshold voltage of the true cell and continues to be reduced with larger threshold voltage shifts in the true cell. For a complement cell to be programmed with margining applied on a true path, the true margining current (i.e., $I_{MT}$) is a function of the threshold voltage of the true cell and is constant for threshold voltage shifts in the complement cell. Therefore, in known sense amplifier circuits, margining applied on the complement path varies dynamically with the threshold voltage shift in the true cell. This results in asymmetry in margining of the true and complement cells. The asymmetry is larger for larger threshold voltage shift (e.g., a large asymmetry will develop above 80 millivolts). In contrast to known systems, the present disclosure has a data-dependent bias generator circuit which provides symmetric margining between "1" and "0" up to 300 millivolts of a threshold voltage (Vt) shift.

Figure 1:
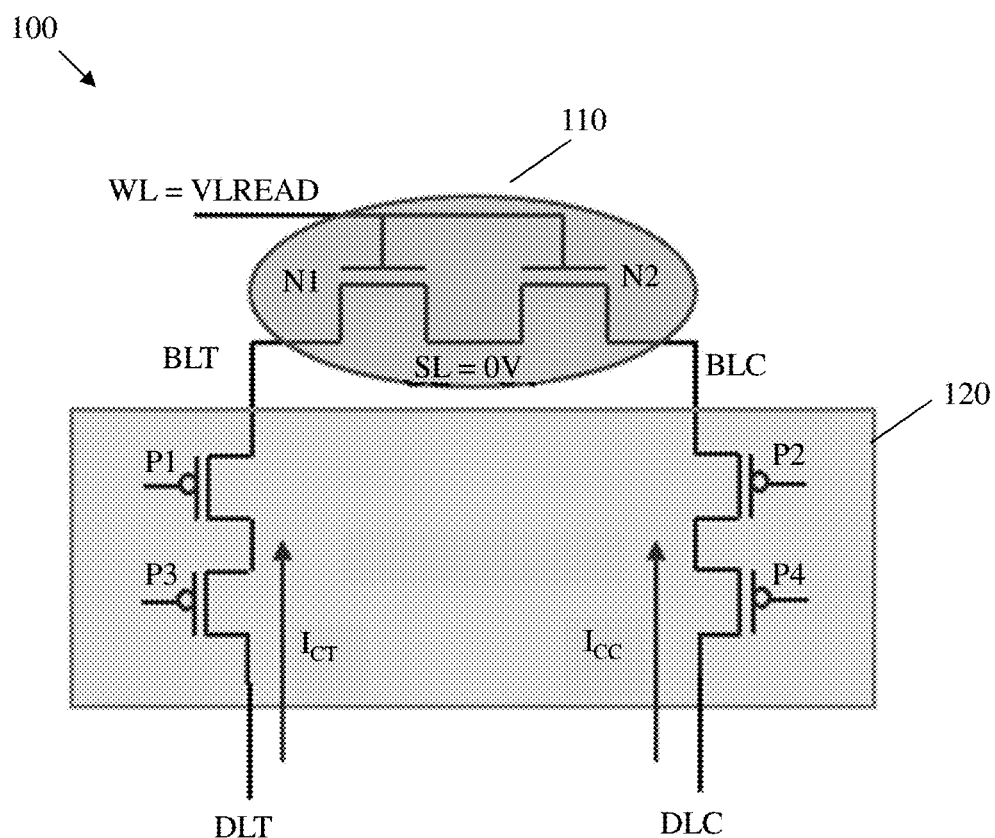
FIG. 1 shows an overview of a twin cell structure of a one time programmable memory (OTPM) structure in accordance with aspects of the present disclosure.

FIG. 1 shows an overview of a twin cell structure of a one time programmable memory (OTPM) structure in accordance with aspects of the present disclosure. In FIG. 1, the twin cell structure 100 includes a bitcell 110 and a bitswitch 120. The bitcell 110 includes a NMOS transistor N1 with a gate connected to a wordline WL, a source connected to a source of a PMOS transistor P1 through a true bitline BLT, and a drain connected to a source of NMOS transistor N2. The bitcell 110 also includes a NMOS transistor N2 with a gate connected to the wordline WL and a drain connected to a source of a PMOS transistor P2 through a complement bitline BLC.

The bitswitch 120 includes the PMOS transistor P1 with a drain connected to a source of a PMOS transistor P3. The PMOS transistor P3 has a drain connected to a true data line DLT. The bitswitch 120 also includes the PMOS transistor P2 with a drain connected to a source of a PMOS transistor P4. The PMOS transistor P4 has a drain connected to a complement data line DLC. In embodiments, the NMOS transistors N1 and N2 are connected in series, PMOS transistors P1 and P3 are connected in series, and the PMOS transistors P2 and P4 are connected in series.

In the operation of the twin cell structure 100 of FIG. 1, programming is accomplished by electron injection into a hi-k dielectric of the NMOS transistors N1 or N2 when a voltage (e.g., 2 volts) is applied to the wordline WL, another voltage (e.g., 1.5 volts) is applied to a source line SL, and zero voltage (i.e., 0 volts) is applied to the bit line BL. For example, when the electrons are trapped in the NMOS transistor N1 and a threshold voltage (i.e., Vt) shift is created on the NMOS transistor N1, a current $I_{CT}$ flows through the true side (i.e., through the true bitline BLT and the true data line DLT) and a logic "1" is output based on the Vt shift. In contrast, when the electrons are trapped in the NMOS transistor N2 and the threshold voltage (i.e., Vt) shift is created on the NMOS transistor N2, a current $I_{CC}$ flows through the complement side (i.e., through the complement bitline BLC and the complement data line DLC) and a logic "0" is output based on the Vt shift. By trapping the electrons through either the NMOS transistor N1 or the NMOS transistor N2, the NMOS transistors N1, N2 are referred to as charge trap transistors. Further, a threshold voltage (i.e., Vt) margining is needed to guarantee a 10 year life time of the charge-trap transistor one time programmable memory (CTT OTPM).

Figure 2:
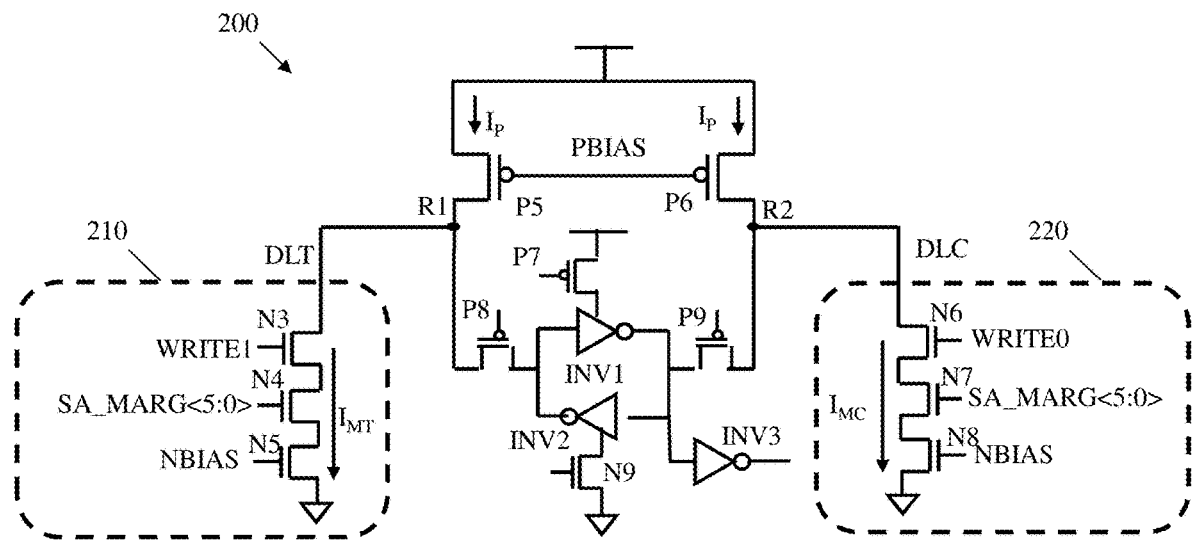
FIG. 2 shows an overview of a sense amplifier with margining control in accordance with aspects of the present disclosure.

FIG. 2 shows an overview of a sense amplifier with margining control in accordance with aspects of the present disclosure. In FIG. 2, a sense amplifier with margining control 200 includes margining branches 210, 220. The margining branch 210 includes a NMOS transistor N3 with a drain connected to a true data line DLT, a gate connected to a WRITE1 signal, and a source connected to a drain of a NMOS transistor N4. NMOS transistor N4 includes a gate connected to a sense amplifier margin signal SA_MARG<5:0> and a source connected to a drain of a NMOS transistor N5. NMOS transistor N5 includes a gate connected to a NBIAS signal and a source connected to ground.

The margining branch 220 includes a NMOS transistor N6 which includes a drain connected to the complement data line DLC, a gate connected to a WRITE0 signal, and a source connected to a drain of a NMOS transistor N7. The NMOS transistor N7 includes a gate connected to the sense amplifier margin signal SA_MARG<5:0> and a source connected to a drain of a NMOS transistor N8. The NMOS transistor N8 includes a gate connected to the NBIAS signal and a source connected to ground. The NMOS transistors N3, N4, and N5 are in series with each other and the NMOS transistors N6, N7, and N8 are also in series with each other.

The sense amplifier with margining control 200 also includes a PMOS transistor P5 with a source connected to a power supply, a gate connected to a PBIAS signal, and a drain connected to a source of a PMOS transistor P8. A PMOS transistor P6 with a source connected to the power supply, a gate connected to the PBIAS signal, and a drain connected to a source of a PMOS transistor P9. A PMOS transistor P7 has a source connected to the power supply and a drain connected to the inverter INV1. The PMOS transistor P8 has a drain connected to the input of the inverter INV1 and output of inverter INV2, and a source connected to node R1. The PMOS transistor P9 has a drain connected to an output of the inverter INV1, and input of inverter INV2, and a source connected to node R2. A NMOS transistor N9 has a drain connected to the inverter INV2 and a source connected to ground.

In FIG. 2, the inverter INV1 receives an input from the drain of the PMOS transistor P8, is enabled by the drain of the PMOS transistor P7, and outputs an inverted signal of the input to the drain of the PMOS transistor P9. The inverter INV2 receives an input from the drain of the PMOS transistor P9, is enabled by the drain of the NMOS transistor N9, and outputs an inverted signal of the input to the drain of the PMOS transistor P8. An inverter INV3 receives an input from the drain of the PMOS transistor P9 and outputs an inverted signal of the input, which forms the final output of the sense amplifier.

Figure 3:
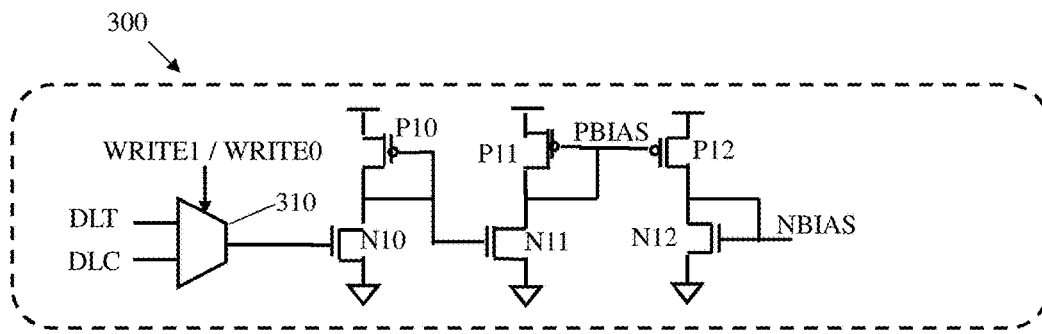
FIG. 3 shows an overview of a feedback logic/bias generator for the sense amplifier of FIG. 2, in accordance with aspects of the present disclosure.

FIG. 3 shows an overview of a feedback logic/bias generator for the sense amplifier of FIG. 2, in accordance with aspects of the present disclosure. The feedback/logic bias generator 300 includes a multiplexer 310 which receives the complement data line DLC and the true data line DLT, is enabled by one of the WRITE0 signal or the WRITE1 signal (i.e., represented as "WRITE1/WRITE 0" in FIG. 2), and outputs an output signal to a gate of NMOS transistor N10. The output signal of the multiplexer 310 will be either the complement data line DLC or the true data line DLT, which corresponds to one of the enable signals (i.e., either the WRITE0 signal or the WRITE1 signal).

The NMOS transistor N10 has a drain connected to a drain of PMOS transistor P10 and a source connected to ground. The PMOS transistor P10 has a source connected to the power supply and a gate connected to a gate of a NMOS transistor N11. The NMOS transistor N11 has a drain connected to a drain of PMOS transistor P11 and a source connected to ground. The PMOS transistor P11 has a source connected to the power supply and a gate connected to the PBIAS signal. A NMOS transistor N12 has a gate connected to the NBIAS signal, a drain connected to a drain of a PMOS transistor P12, and a source connected to ground. The PMOS transistor P12 has a gate connected to the PBIAS signal and a source connected to the power supply.

In the operation of the circuits shown in FIGS. 2 and 3, the feedback/logic bias generator 300 picks the complement data line DLC or the true data line DLT based on the WRITE1 signal/WRITE0 signal for the PBIAS and NBIAS signal generation. Further, the PBIAS/NBIAS signals are generated from the field effect transistor (FET) that remains at a native state, which avoids asymmetry in programming the true FET or complement FET. In other words, the feedback/logic bias generator 300 generates the PBIAS signal, which is a setting bias for the PFETs in the sense amplifier with margining control 200. Further, the feedback/ logic bias generator 300 generates the NBIAS signal, which is a control margin for the threshold voltage (Vt) in the sense amplifier with margining control 200.

In an example, when programming a true side of the sense amplifier with margining control 200, the complement data line DLC is selected by the multiplexer 310 and output to the gate of the NMOS transistor N10. This ensures a constant margin current regardless of a magnitude of the threshold voltage (Vt) shift by appropriately setting the PBIAS and NBIAS signals. Further, in another example, when programming a complement side of the sense amplifier with margining control 200, the true data line DLT is selected by the multiplexer 310 and output to the gate of the NMOS transistor N10. This also ensures a constant margin current regardless of the magnitude of the Vt shift by appropriately setting the PBIAS and NBIAS signals.

With respect to FIGS. 2 and 3, the sense amplifier with margining control 200 uses the PBIAS signal from the feedback/logic bias generator 300 to keep symmetry and ensure that the PBIAS signal is constant throughout the operation. Further, when programming the true side (i.e., the true data line DLT side) of the sense amplifier with margining control 200, the complement data line DLC is balanced through the margining branch 220 by matching the appropriate sense amplifier margin signal SA_MARG<5:0> and the appropriate NBIAS signal using the feedback/logic bias generator 300. Also, when programming the complement side (i.e., the complement data line DLC side) of the sense amplifier with margining control 200, the true data line DLT is balanced through the margining branch 210 by matching the appropriate sense amplifier margin signal SA_MARG<5:0> and the appropriate NBIAS signal using the feedback/logic bias generator 300. The sense amplifier margin signal SA_MARG<5:0> has six margin bits, but is not limited and could be <N:0> (e.g., where N is an integer number). For example, the number of margin bits can be increased when a larger margining is required (e.g., each margin bit correspond with approximately 7 millivolt increments).

Figure 4:
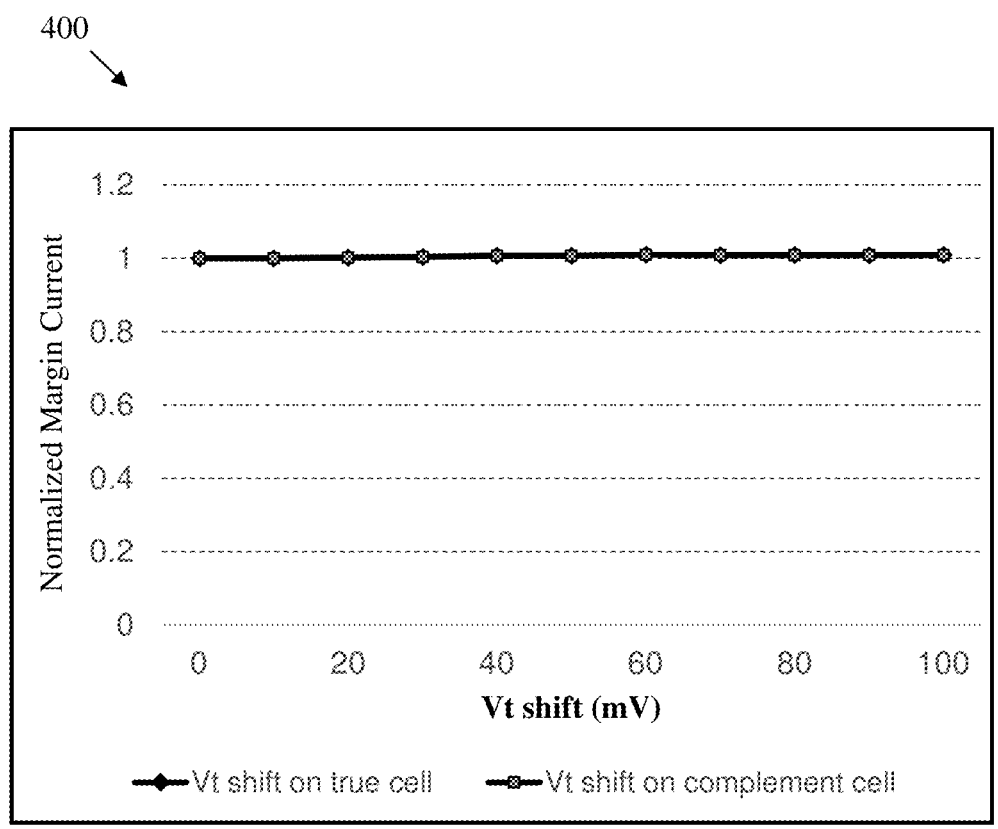
FIG. 4 shows a graph of a normalized margin current in accordance with aspects of the present disclosure.

FIG. 4 shows a graph of a normalized margin current in accordance with aspects of the present disclosure. For an ideally matched true and complement FETs with no additional margin incorporated, the currents from FIGS. 1 and 2 are related by the following equation ($I_{CT}$ is from a true side and $I_{CC}$ is from a complement side):

$$I_P = I_{CT} = I_{CC} \quad \text{(Equation 1)}.$$

When a true cell is programmed (i.e., the true side is programmed) and margining is applied on the complement arm, the currents from FIGS. 1 and 2 are related by the equations below ($I_{CT}$ is from a true side and $I_{CC}$ is from a complement side):

$$I_P = I_{CT}(Vt) + I_{MT} \quad \text{(Equation 2)}.$$

$$I_P = I_{CC} \quad \text{(Equation 3)}.$$

$$I_{MT} = f(\text{complement cell } Vt) \rightarrow \text{constant} \quad \text{(Equation 4)}.$$

When a complement cell is programmed (i.e., the complement side is programmed) and margining is applied on the true side), the currents from FIGS. 1 and 2 are related by the equations below ($I_{CT}$ is from a true side and $I_{CC}$ is from a complement side):

$$I_P = I_{CC}(Vt) + I_{MC} \quad \text{(Equation 5)}.$$

$$I_P = I_{CT} \quad \text{(Equation 6)}.$$

$$I_{MC} = f(\text{true cell } Vt) \rightarrow \text{constant} \quad \text{(Equation 7)}.$$

In the graph 400 of FIG. 4, the threshold voltage (Vt) shift is shown on the x-axis in millivolts and normalized margin current is shown on the y-axis. Further, the voltage shift on the true cell is marked by a diamond with a black line through the diamond and the complement cell is marked by a rectangle with a black line through the rectangle. In contrast to known sense amplifier circuits, in which asymmetry occurs in margining of the true and complement cells, the graph 400 of the present disclosure shows that the normalized margin current is constant and there is no asymmetry that occurs in margining of the true and complement cells (i.e., the true and complement cells have an identical margin current across the entire threshold voltage (Vt) shift spectrum).

Figure 5:
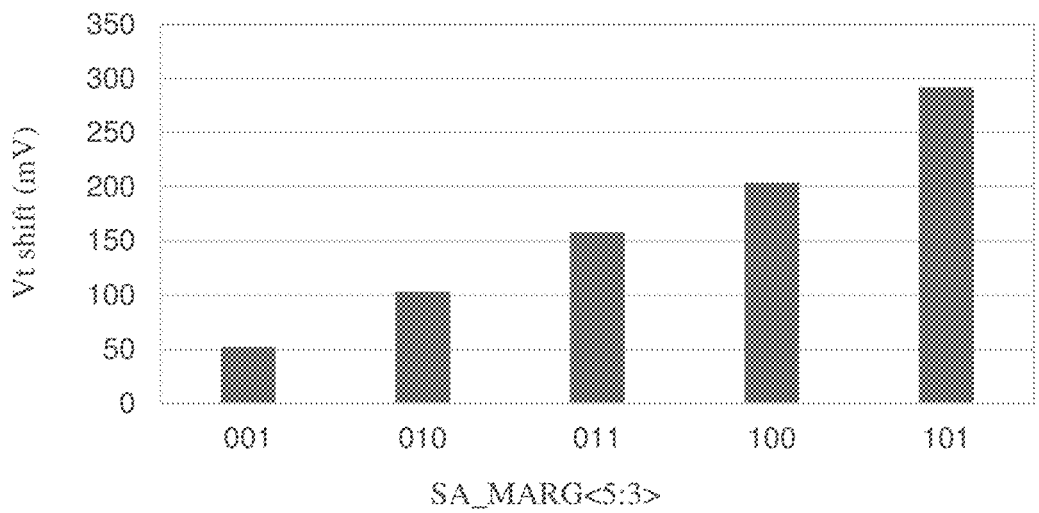
FIG. 5 shows a graph of a coarse control of the threshold voltage shift in accordance with aspects of the present disclosure.

FIG. 5 shows a graph of a coarse control of the threshold voltage shift, in accordance with aspects of the present disclosure. In the graph 500 of FIG. 5, the sense amplifier margin signal SA_MARG<5:3> is shown on the x-axis and a threshold voltage (Vt) shift in millivolts for the y-axis. In particular, the sense amplifier margin signal bits of the sense amplifier margin signal SA_MARG is for the coarse control (i.e., bits 3, 4, and 5), which can be represented as "001", "010", "011", "100", and "101". As shown in FIG. 5, the threshold voltage (Vt) shift is greater at a higher value (e.g., "101") than at a lower value (e.g., "001"). Further, the threshold voltage (Vt) increases in 50 millivolt increments for each value (i.e., from "001" to "010") for the coarse control.

Figure 6:
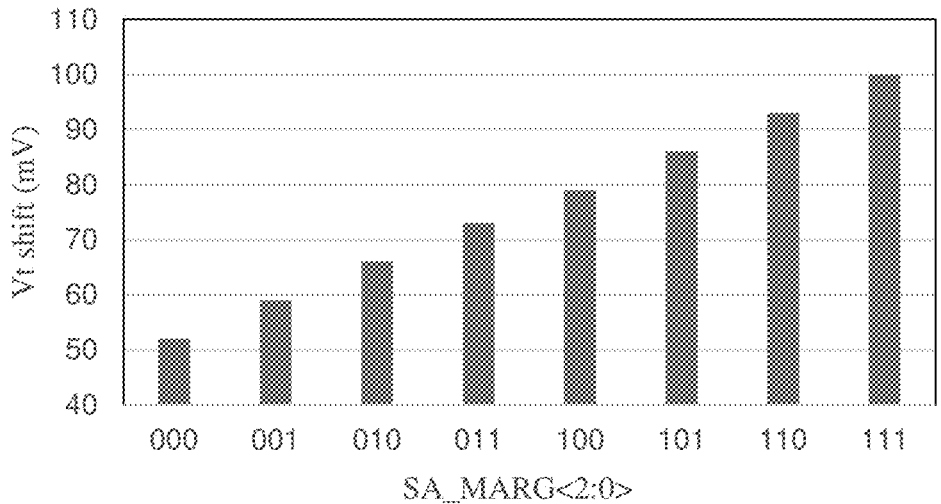
FIG. 6 shows a graph of a fine control of the threshold voltage shift in accordance with aspects of the present disclosure.

FIG. 6 shows a graph of a fine control of the threshold voltage shift in accordance with aspects of the present disclosure. In the graph 600 of FIG. 6, the sense amplifier margin signal SA_MARG<2:0> is shown on the x-axis and a threshold voltage (Vt) shift in millivolts for the y-axis. The sense amplifier margin signal bits of the sense amplifier margin signal SA_MARG is for the fine control (i.e., bits 0, 1, and 2), which can be represented as "000", "001", "010", "011", "100", "101", "110", and "111". As shown in FIG. 6, the threshold voltage (Vt) shift is greater at a higher value (e.g., "101") than at a lower value (e.g., "001"). Further, the threshold voltage (Vt) increases in approximately 7 millivolt increments for each value (i.e., from "001" to "010") for the fine control.

Figure 7:
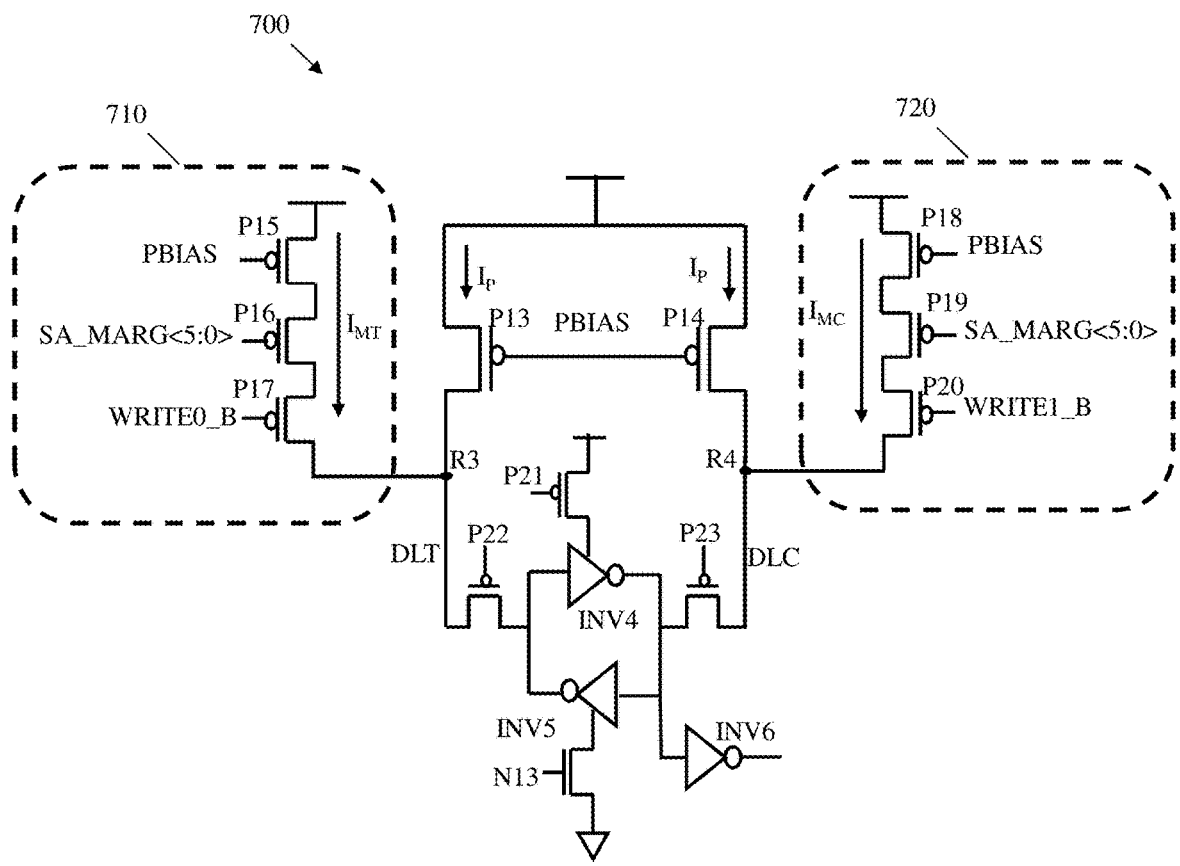
FIG. 7 shows an overview of another sense amplifier with margining control in accordance with aspects of the present disclosure.

FIG. 7 shows an overview of another sense amplifier with margining control in accordance with aspects of the present disclosure. In FIG. 7, the sense amplifier with margining control 700 includes margining branches 710, 720. Further, in FIG. 7, the PMOS transistors P13, P14, P21, P22, and P23 are in a similar configuration as the PMOS transistors P5, P6, P7, P8, and P9 of FIG. 2. In FIG. 7, the inverters INV4, INV5, and INV6 are in a similar configuration as the inverters INV1, INV2, and INV3 of FIG. 2. Lastly, the NMOS transistor N13 in FIG. 7 is in a similar configuration as the NMOS transistor N9 of FIG. 2.

In FIG. 7, the margining branches 710, 720 have a different configuration than the margining branches 210, 220 of FIG. 2. In particular, in the margining branch 710, a PMOS transistor P15 has its source connected to the power supply, the gate connected to the PBIAS signal, and its drain connected to a source of PMOS transistor P16. The PMOS transistor P16 has its gate connected to the sense amplifier margin signal SA_MARG<5:0> and its drain connected to a source of PMOS transistor P17. The PMOS transistor P17 has its gate connected to WRITE0_B signal and its drain connected to a R3 node.

The margining branch 720 of FIG. 7 includes a PMOS transistor P18 with a source connected to the power supply, a gate connected to the PBIAS signal, and a drain connected to a source of PMOS transistor P19. The PMOS transistor P19 has a gate connected to the sense amplifier margin signal SA_MARG<5:0> and a drain connected to a source of PMOS transistor P20. The PMOS transistor P20 has a gate connected to the WRITE1_B signal and a drain connected to a R4 node.

Figure 8:
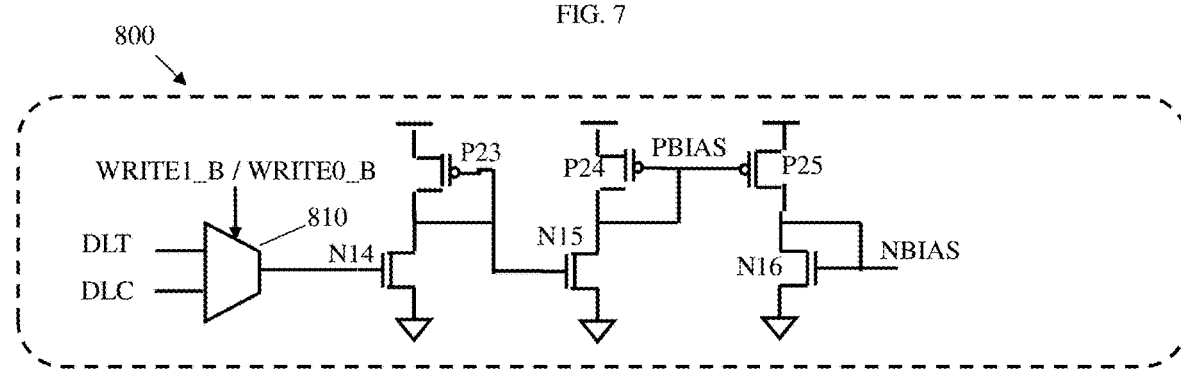
FIG. 8 shows an overview of another feedback logic/bias generator for the sense amplifier in FIG. 7, in accordance with aspects of the present disclosure.

FIG. 8 shows an overview of another feedback logic/bias generator for the sense amplifier in FIG. 7, in accordance with aspects of the present disclosure. In FIG. 8, the feedback logic/bias generator 800 is similar to the configuration of the feedback/logic bias generator 300 of FIG. 3 with the exception of the multiplexer 810 receiving the WRITE1_B or WRITE0_B as the enable signal, instead of the WRITE1/WRITE0 signal in FIG. 3. In particular, the PMOS transistors P23, P24, and P25 have a similar configuration as the PMOS transistors P10, P11, and P12 of FIG. 3. Further, the NMOS transistors N14, N15, and N16 have a similar configuration as the NMOS transistors N10, N11, and N12 of FIG. 3.

In the operation of FIGS. 7 and 8, the feedback/logic bias generator 800 picks the complement data line DLC or the true data line DLT based on the WRITE1_B signal/WRITE0_B signal for the PBIAS and NBIAS signal generation. Further, the PBIAS signal is generated from the field effect transistor (FET) that remains at a native state, which avoids asymmetry in programming the true FET or complement FET. In other words, the feedback/logic bias generator 800 generates the PBIAS signal, which is a setting bias for the PFETs in the another sense amplifier with margining control 700.

With respect to FIG. 7, the PBIAS signal is also used in the margining branches 710, 720. In an example, when programming a true side of the sense amplifier with margining control 700, the complement data line DLC is selected by the multiplexer 810 and is output to the gate of the NMOS transistor N14. This ensures a constant margin current regardless of a magnitude of the threshold voltage (Vt) shift by appropriately setting the PBIAS signal. Further, in another example, when programming a complement side of the another sense amplifier with margining control 700, the true data line DLT is selected by the multiplexer 810 and is output to the gate of the NMOS transistor N14. This also ensures a constant margin current regardless of the magnitude of the Vt shift by appropriately setting the PBIAS signal.

Still with respect to FIGS. 7 and 8, the sense amplifier with margining control 700 uses the PBIAS signal from the feedback/logic bias generator 800 to keep symmetry and ensure the PBIAS signal is constant throughout the operation. Further, when programming the true side (i.e., the true data line DLT side) of the sense amplifier with margining control 700, the complement data line DLC is balanced through the margining branch 720 by matching the appropriate sense amplifier margin signal SA_MARG<5:0> and the appropriate PBIAS signal using the feedback/logic bias generator 800. Also, when programming the complement side (i.e., the complement data line DLC side) of the sense amplifier with margining control 700, the true data line DLT is balanced through the margining branch 710 by matching the appropriate sense amplifier margin signal SA_MARG<5:0> and the appropriate PBIAS signal using the feedback/logic bias generator 800. The sense amplifier margin signal SA_MARG<5:0> has six margin bits, but is not limited and the bits could be <N:0> (e.g., where N is an integer number). For example, in a non-limiting example, the number of margin bits can be increased when a larger margining is required (e.g., each margin bit will correspond with approximately 7 millivolt increments).

The circuit and the method of operation for a data dependent sense amplifier with symmetric margining for charge trap transistor memories of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a data dependent sense amplifier with symmetric margining for charge trap transistor memories of the present disclosure has been adopted from integrated circuit (IC) technology. For example, the structures are built on wafers and are realized in films of material patterned by photolithographic processes on the top of a wafer. In particular, the fabrication of the circuit and the method for a data dependent sense amplifier with symmetric margining for charge trap transistor memories uses three basic building blocks: (i) deposition of thin films of material on a substrate, (ii) applying a patterned mask on top of the films by photolithographic imaging, and (iii) etching the films selectively to the mask.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a bias generator circuit that is configured to provide symmetric margining between two logic states of a memory circuit across a threshold voltage shift,
    wherein the bias generator circuit comprises a multiplexer configured to select and output a true data line in response to programming a complement side of the memory circuit and to select and output a complement data line in response to programming a true side of the memory circuit.

2. The structure of claim 1, wherein the bias generator circuit further comprises three NMOS transistors and three PMOS transistors to generate a first bias signal and a second bias signal.

3. The structure of claim 2, wherein the memory circuit further comprises a sense amplifier circuit, a first margining branch circuit on the true side, and a second margining branch circuit on the complement side.

4. The structure of claim 3, wherein the sense amplifier circuit comprises five PMOS transistors, one NMOS transistor, and three inverters and is configured to receive the first bias signal to keep the symmetric margining between the two logic states.

5. The structure of claim 3, wherein the first margining branch circuit comprises three NMOS transistors and is configured to receive a sense amplifier margining signal and the second bias signal to provide a control margin to balance a margining current in response to programming of the complement side of the memory circuit.

6. The structure of claim 3, wherein the second margining branch circuit comprises three NMOS transistors and is configured to receive a sense amplifier margining signal and the second bias signal to provide a control margin to balance a margining current in response to programming of the true side of the memory circuit.

7. The structure of claim 1, wherein the memory circuit comprises a twin-cell transistor circuit which is programmed on one of a true side and a complement side to generate one logic state of the two logic states.

8. The structure of claim 7, wherein the memory circuit further comprises a one-time programmable memory (OTPM).

9. A circuit, comprising:
a bias generator circuit that is configured to provide symmetric margining between two logic states by generating a first bias signal and a second bias signal; and
a sense amplifier and margining circuit which is configured to receive the first bias signal and the second bias signal to provide a control margin to balance a margining current in response to programming of a twin-cell transistor circuit.

10. The circuit of claim 9, wherein the bias generator circuit comprises a multiplexer which is configured to select and output a true data line in response to programming a complement side of the twin-cell transistor circuit and is configured to select and output a complement data line in response to programming a true side of the twin-cell transistor circuit.

11. The circuit of claim 10, wherein the bias generator circuit further comprises three NMOS transistors and three PMOS transistors to generate the first bias signal and the second bias signal based on an output of the multiplexer.

12. The circuit of claim 11, wherein the sense amplifier and margining circuit comprises a sense amplifier circuit which includes five PMOS transistors, one NMOS transistor, and three inverters and is configured to receive the first bias signal to keep a symmetric margining.

13. The circuit of claim 12, wherein the sense amplifier and margining circuit comprises a first margining branch circuit which includes three PMOS transistors and is configured to receive a sense amplifier margining signal and the second bias signal to provide the control margin to balance the margining current in response to programming the complement side of the twin-cell transistor circuit.

14. The circuit of claim 12, wherein the sense amplifier and margining circuit comprises a second margining branch circuit which includes three PMOS transistors and is configured to receive a sense amplifier margining signal and the second bias signal to provide the control margin to balance the margining current in response to programming the true side of the twin-cell transistor circuit.

15. The circuit of claim 14, wherein the programming of the twin-cell transistor circuit generates a logic state based on a threshold voltage shift being created on one transistor device of the twin-cell transistor circuit.

16. A method comprising:
programming one of a true side or a complement side of a twin-cell transistor circuit;
generating a first bias signal and a second bias signal in a bias generator circuit in response to the programming one of the true side or the complement side of the twin-cell transistor circuit;
receiving the first bias signal and the second bias signal at the sense amplifier and margining circuit; and
generating a symmetric margin current in the sense amplifier and margining circuit across a threshold voltage shift of the twin-cell transistor circuit in response to the sense amplifier and margining circuit receiving the first bias signal and the second bias signal.

17. The method of claim 16, further comprising:
selecting a true data line in the bias generator circuit in response to programming the complement side of the twin-cell transistor circuit; and
generating the first bias signal and the second bias signal in the bias generator circuit based on the true data line being selected.

18. The method of claim 16, further comprising:
selecting a complement data line in the bias generator circuit in response to programming the true side of the twin-cell transistor circuit; and
generating the first bias signal and the second bias signal in the bias generator circuit based on the complement data line being selected.

19. The method of claim 16, wherein the programming of the one of the true side or the complement side of the twin-cell transistor circuit will output a corresponding logic state.

* * * * *